(12) United States Patent
Harada et al.

(10) Patent No.: US 6,402,844 B1
(45) Date of Patent: Jun. 11, 2002

(54) SUBSTRATE PROCESSING METHOD AND SUBSTRATE PROCESSING UNIT

(75) Inventors: Koji Harada; Ryoichi Uemura, both of Kumamoto-ken (JP)

(73) Assignee: Tokyo Electron Limited, Tokyo-tu (JP)

( * ) Notice: Subject to any disclaimer, the term of this patent is extended or adjusted under 35 U.S.C. 154(b) by 0 days.

(21) Appl. No.: 09/391,408

(22) Filed: Sep. 8, 1999

(30) Foreign Application Priority Data

Sep. 8, 1998 (JP) .......................................... 10-270552

(51) Int. Cl.[7] .............................................. C23C 16/00
(52) U.S. Cl. ..................... 118/666; 118/715; 118/725; 118/663; 118/664; 118/679; 118/684; 118/708
(58) Field of Search ................................ 118/715, 725, 118/663, 664, 666, 679, 684, 708, 712

(56) References Cited

U.S. PATENT DOCUMENTS

| | | | |
|---|---|---|---|
| 3,919,968 A | * 11/1975 | Sandmann et al. ............ | 118/5 |
| 5,290,381 A | * 3/1994 | Nozawa et al. .............. | 156/345 |
| 5,401,316 A | 3/1995 | Shiraishi et al. | |
| 5,879,459 A | * 3/1999 | Gadgil et al. ................ | 118/715 |
| 5,903,711 A | * 5/1999 | Okase ......................... | 392/418 |
| 6,129,044 A | * 10/2000 | Zhao et al. .................. | 118/715 |
| 6,156,151 A | * 12/2000 | Kimino et al. .............. | 156/345 |

FOREIGN PATENT DOCUMENTS

JP   62-22420   * 1/1997

* cited by examiner

*Primary Examiner*—Jeffrie R. Lund
(74) *Attorney, Agent, or Firm*—Robert S. Green, Esq.; Rader, Fishman & Grauer, PLLC

(57) ABSTRACT

Process gas supply/stop operations are intermittently performed. As the hydrophobic process progresses, the temperature of a gas contract portion of a wafer lowers. While the hydrophobic process stops, the temperature of the gas contact portion of the wafer rises to the original temperature. Thereafter, the hydrophobic process resumes. Thus, while the temperature of the gas contact portion of wafer is suppressed from largely lowering, the hydrophobic process can be performed. Thus, non-uniformity of the hydrophobic process on the front surface of the wafer is reduced.

11 Claims, 8 Drawing Sheets

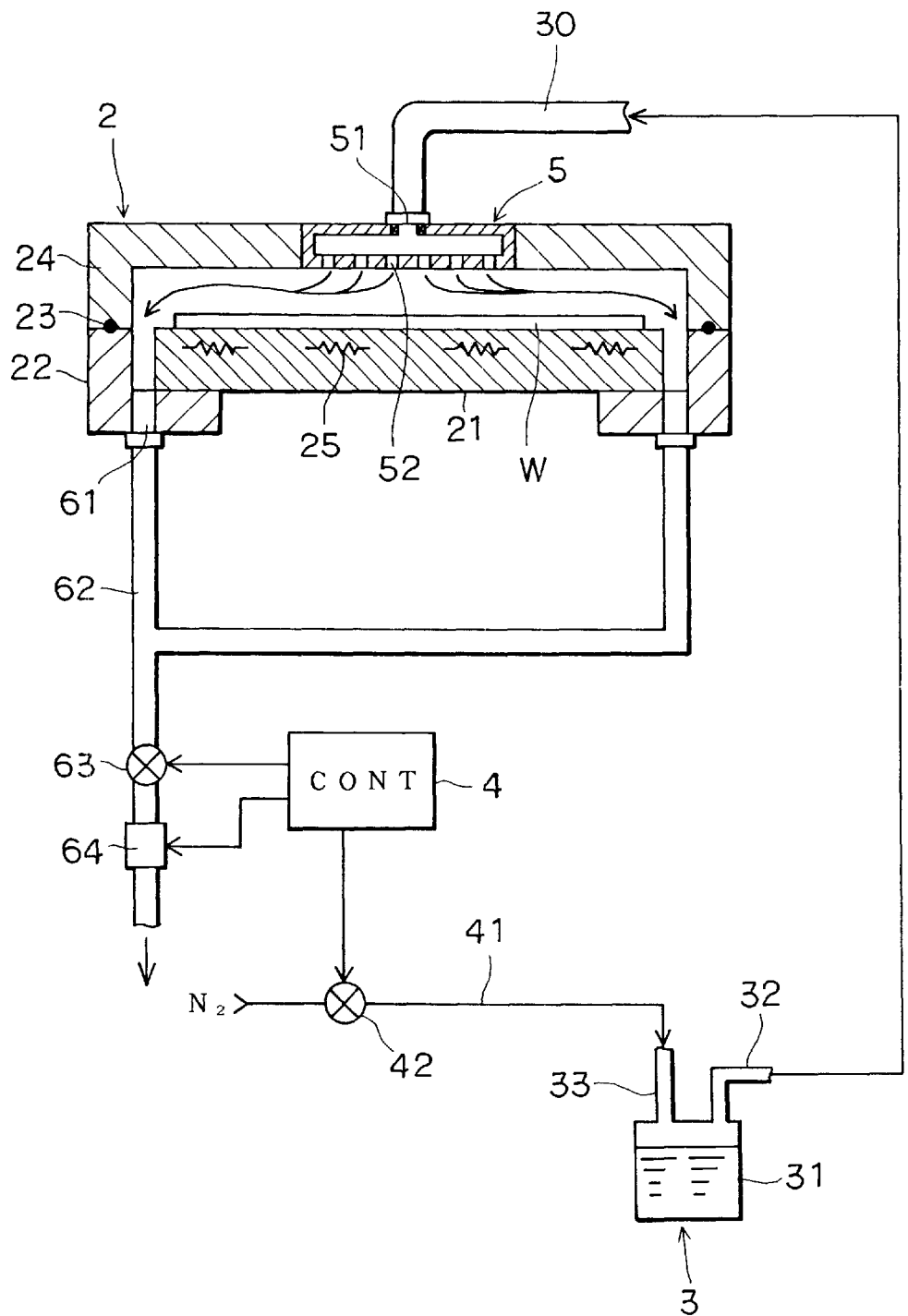
F I G. 1

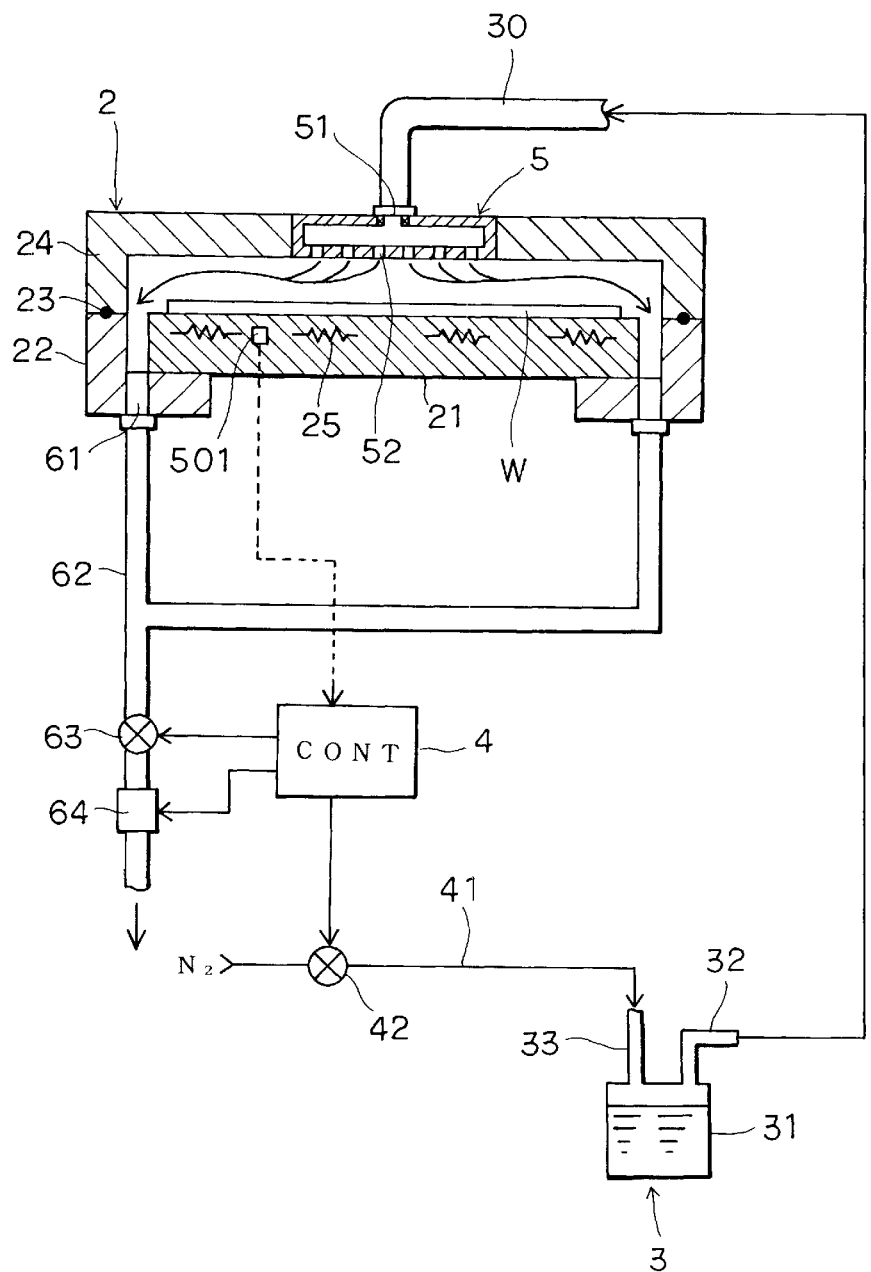
F I G. 5

SUBSTRATE PROCESSING METHOD AND SUBSTRATE PROCESSING UNIT

BACKGROUND OF THE INVENTION

1. Field of the Invention

The present invention relates to a substrate processing method and a substrate processing unit for processing the front surface of a substrate with a process gas.

2. Description of the Related Art

A mask is used to form a desired pattern on the front surface of a semiconductor wafer (hereinafter referred to as wafer) or a glass substrate of a liquid crystal display (the glass substrate is hereinafter referred to as LCD substrate). Such a mask is formed by coating a resist on the front surface of a wafer or the like, radiating a light beam, an electron beam, or an ion beam to the front surface of the resist, and developing the resist. To prevent the resist mask from peeling off the substrate in a developing process, an ion implanting process, and an etching process, the adhesion between the substrate and the resist should be improved. To prevent such a problem, before resist solution is coated on the front surface of a substrate, a hydrophobic process is performed on the front surface of the substrate.

A hydrophobic processing unit that performs the hydrophobic process has an airtight vessel that holds and heats a wafer. While process gas that contains HMDS (hexamethyldisilane) gas is being supplied to the airtight vessel, the airtight vessel is exhausted. When a wafer is loaded to the airtight vessel, the process gas is supplied there to successively for around 20 seconds. At the same time, the airtight vessel is exhausted.

For example, the airtight vessel has a gas supply inlet through which the process gas is supplied. The gas supply inlet is disposed above the center portion of the wafer held in the airtight vessel. In addition, an exhaust outlet is disposed outside the periphery of the wafer. Thus, the process gas enters the airtight vessel from the gas supply inlet, hits the center portion of the wafer, flows to the periphery of the wafer along the front surface thereof, and exits from the exhaust opening.

Alternatively, the gas supply inlet and the exhaust outlet may be disposed at the reverse positions of the above-described airtight vessel. In other words, the process gas is supplied from the periphery of the wafer and exhausted from an upper position of the center portion of the wafer.

As another alternative method, the gas supply inlet and the exhaust outlet may be oppositely disposed. In this case, the process gas flows along the front surface of the wafer and exits from the exhaust outlet.

However, since the temperature of the process gas such as the HMDS gas that enters into the airtight vessel is lower than the temperature of the wafer, when the process gas enters the airtight vessel from the gas supply inlet and hits the center portion of the wafer, the center portion of the wafer is more cooled than the periphery thereof. Likewise, when the process gas enters the airtight vessel from a position in the vicinity of the periphery of the wafer and exits from an upper position of the center portion of the wafer, the periphery of the wafer is more cooled than the center portion thereof. In addition, when the process gas enters the airtight vessel from a side portion thereof and exits from the opposite side portion thereof, the wafer portion on the gas supply inlet side is more cooled than the wafer portion on the exhaust outlet side.

In any type of the above-described units, a temperature difference takes place along the direction of the flow of the process gas. Thus, the temperature distribution on the surface of the wafer W becomes unequal. For example, in the hydrophobic process using HMDS gas, the hydrophobicity on the front surface of the wafer is proportional to the process temperature of the wafer. Thus, in any type of the above-described units, the hydrophobicity of the wafer portion in the vicinity of the gas supply inlet deteriorates.

As an index that represents the hydrophobicity (or hydrophilicity), the contact angle of a water drop on the front surface of the wafer W is used. In any type of the above-described units, the contact angle on the wafer that has been hydrophobicity-processed deviates for around 3 to 4 degrees.

SUMMARY OF THE INVENTION

An object of the present invention is to provide a substrate processing method and a substrate processing unit that suppress the state (for example, the hydrophobicity) of the surface process of a substrate from deviating.

A first aspect of the present invention is a method for processing a substrate in an airtight vessel with a process gas, the method comprising the steps of (a) conveying the substrate into the airtight vessel, and (b) supplying the process gas to the airtight vessel in which the substrate has been conveyed while controlling the flow rate of the process gas.

A second aspect of the present invention is a substrate processing unit, comprising an airtight vessel having a substrate holding portion, a process gas supplying means for supplying process gas to the airtight vessel, and a controlling means for controlling the flow rate of the process gas supplied to the airtight vessel.

According to the present invention, since the process gas supply/stop operations are intermittently performed, as the surface process progresses, the temperature of the substrate portion lowers. While the surface process stops, the temperature of the substrate portion rises to the original temperature. Thereafter, the surface process resumes. Thus, while the temperature of the wafer portion to which the process gas hits is suppressed from largely lowering, the surface process can be performed. Thus, non-uniformity of the surface process on the front surface of the wafer (for example, hydrophobicity) is reduced.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 1 is a sectional view showing an example of the structure of a substrate processing unit for use with a substrate processing method according to an embodiment of the present invention;

FIG. 5 is a sectional view showing another example of the structure of the substrate processing unit according to the present invention;

DESCRIPTION OF THE PREFERRED EMBODIMENTS

Figure 2:
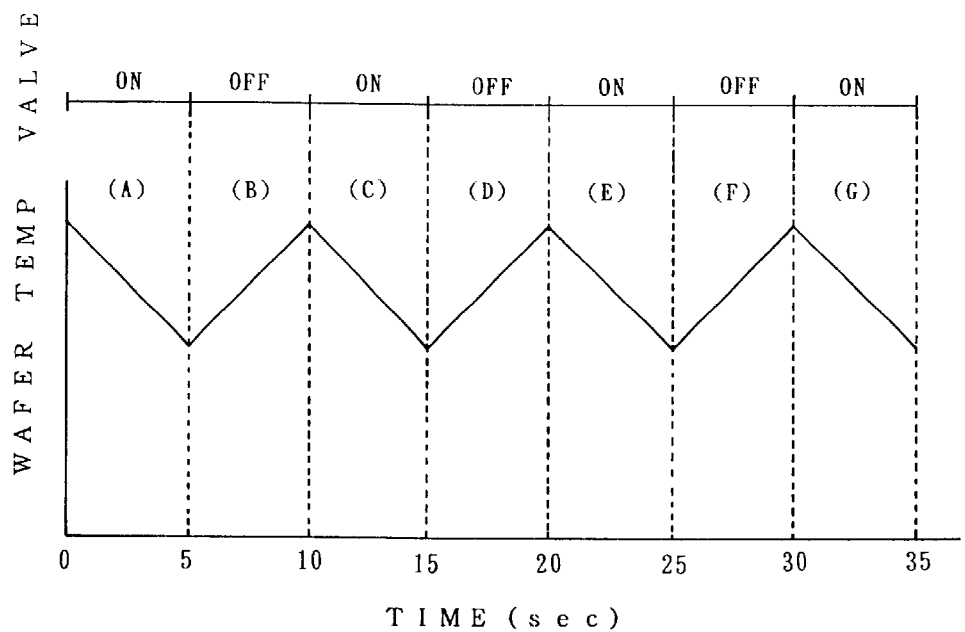
FIG. 2 is a graph showing an example of the variation of the wafer temperature in the substrate processing method according to the present invention.

FIG. 1 shows the structure of a hydrophobic processing unit according to an embodiment of the present invention. Referring to FIG. 1, the hydrophobic processing unit comprises an airtight vessel 2, an HMS supplying source 3, and a controlling means 4. The airtight vessel 2 airtightly holds a wafer W that is a substrate. The HMDS supplying source 3 supplies HMDS gas as process gas to the airtight vessel 2 through a gas flow path 30. The controlling means 4 controls the HMDS gas supply/stop operations for the airtight vessel 2.

The airtight vessel 2 comprises a table 21, a base 22, and a lid 24. The table 21 is a holding portion on which a wafer W is placed. The base 22 supports the table 21. The lid 24 contacts the peripheral portion of the base 22 through a seal member 23. The table 21, the base 22, and the lid 24 compose the airtight vessel 2. The table 21 has a heating means 25 that heats a wafer w at for example 90° C. to 110° C. The heating means 25 is composed of for example a resistor heating wire.

At a center portion of the lid 24, for example a spreading plate 5 is disposed. The spreading plate 5 is composed of a hollow vessel. A gas inlet 51 is formed on the upper surface of the spreading plate 5. A gas flow path 30 is connected to the gas inlet 51. Many gas openings 52 are formed on the bottom surface of the spreading plate 5.

For example, four to six exhaust openings 61 are formed on the base 22 of the airtight vessel 2. The exhaust openings 61 are formed on the outer periphery of the table 21. A valve 63 is connected to the exhaust openings 61 through gas exhaust paths 62. An exhaust pump 64 is connected downstream of the valve 63. The exhaust openings 61, the gas exhaust paths 62, the valve 63, and the exhaust pump 64 compose an exhausting means that exhausts gas from the airtight vessel 2.

The HMDS supplying source 3 has a reservoir 31 that is an airtight chemical storing portion. The reservoir 31 stores HMDS solution. By spraying for example $N_2$ gas to the front surface of the HMDS solution stored in the reservoir 31, gas of HMDS solution is produced. The produced HMDS gas is supplied to the gas flow path 30 through an exhaust nozzle 32 connected to the reservoir 31. The $N_2$ gas is supplied from an $N_2$ gas bottle or the like (not shown) through an $N_2$ nozzle 33 connected to the reservoir 31. The diameter of the $N_2$ nozzle 33 is for example 1 mm. In the example shown in FIG. 1, one $N_2$ nozzle 33 is connected to the reservoir 31.

A valve 42 is disposed in the middle of an $N_2$ supplying path 41 connected between the $N_2$ gas bottle or the like (not shown) and the $N_2$ nozzle 33 of the reservoir 31. The valve 42 causes the $N_2$ gas to be supplied or not to be supplied to the reservoir 31. When the valve 42 is in the open state, the $N_2$ gas is supplied to the HMDS reservoir 31. Thus, the HMDS gas is supplied from the reservoir 31 to the airtight vessel 2. In contrast, when the valve 42 is in the close state, the $N_2$ gas is not supplied to the reservoir 31. Thus, the HMDS gas is not supplied to the airtight vessel 2. The controlling portion 4 controls the open/close operations of the valves 42 and 63 and the activation/deactivation of the exhaust pump 64.

The controlling portion 4 comprises a timer, a driving mechanism portion, and a driving controlling portion. The timer determines timings of the open/close operations of the valves 42 and 63. The driving mechanism portion is composed of solenoids, motors, and so forth that open and close the valves 42 and 43. The driving controlling portion controls drive force supplied to the driving mechanism portion.

Next, the operation of the hydrophobic processing unit according to the embodiment of the present invention will be described. A wafer W is conveyed to the hydrophobic processing unit by a conveying arm (not shown). At this point, the lid 24 of the airtight vessel 2 is opened. The wafer W is placed on the table 21 of the airtight vessel 2 by a collaboration operation of lift pins (not shown) that are disposed in the table 21 and the conveying arm. At this point, the table 21 is heated at 90° C. to 110° C. Thereafter, the lid 24 is closed. The valve 63 on the exhaust side is opened. The exhaust pump 64 is activated. Thereafter, the valve 42 is opened. Thus, the HMDS gas is supplied to the airtight vessel 3. Thereafter, the valve 42 is opened and closed corresponding to a predetermined control pattern. Thus, the HMDS gas supply/stop operations are performed. Corresponding to the control pattern, the hydrophobic process progresses.

FIG. 2 is a graph showing an example of the variation of the temperature of the wafer corresponding to the open/close operations of the valve 42 (namely, the HMDS gas supply/stop operations) performed by the controlling portion 4. In the example shown in FIG. 2, the valve 42 is opened for five seconds at intervals of five seconds four times. In other words, the HMDS gas is supplied to the airtight vessel 2 successively for five seconds (period (A), FIG. 2). Thereafter, the valve 42 is closed successively for five seconds (period (B), FIG. 2). This cycle is performed three times (periods (C) to (G), FIG. 2). In each cycle, the exhaust valve 63 is opened. The exhaust pump 64 is activated. Thus, the airtight vessel 2 is exhausted. In the HMDS gas supply periods (periods (A), (C), (E), and (G), FIG. 2), the hydrophobic process progresses. On the other hand, in the HMDS gas stop periods (periods (B), (D), and (F), FIG. 2), the hydrophobic process stops.

According to the control pattern shown in FIG. 2, the temperature of a wafer portion cooled by the HMDS gas (namely, the center portion of the wafer in the example shown in FIG. 1) lowers in the HMDS gas supply periods (periods (A), (C), (E), and (G), FIG. 2). However, since the wafer W is heated by the table 21, in the HMDS gas supply stop periods (periods (B), (d), and (F), FIG. 2), the temperature of the portion of the wafer rises to around the original temperature.

According to the above-described embodiment, since the HMDS gas supply/stop operations are intermittently performed, as the hydrophobic process progress, the temperature of the wafer portion lowers. However, when the hydrophobic process stops, the temperature of the wafer portion rises to the original temperature. Thereafter, the hydrophobic process resumes. Thus, while the temperature of the wafer portion to which the gas hits is suppressed from largely lowering, the hydrophobic process can be performed. Thus, the hydrophobicity on the front surface of the wafer can be suppressed from deviating.

In addition, according to the above-described embodiment, while the HMDS gas is not supplied, since the HMDS evaporates in the reservoir 31 of the HMDS supplying source 3, the concentration of the HMDS gas rises. Thus, the hydrophobic process can be performed with HMDS gas with higher concentration than the conventional method of which the HMDS gas is successively supplied. Consequently, even if the HMDS gas supply time period is for example 20 seconds as with the conventional method, the hydrophobic process more progresses than the conventional method. In addition, since the concentration of the HMDS gas of the above-described embodiment is higher than the conventional method, the process time period can be shortened.

Figure 3:
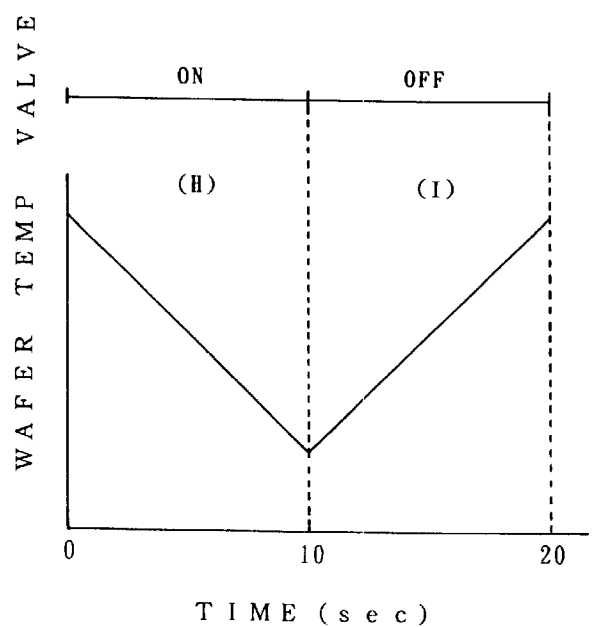
FIG. 3 is a graph showing another example of the variation of the wafer temperature in the substrate processing method according to the present invention.

FIG. 3 is a graph showing another example of the variation of the wafer temperature corresponding to the HMDS gas supply/stop operations due to the open/close operations of the valve 42. In the example shown in FIG. 3, the valve 42 is opened successively for 10 seconds. Thus, the HMDS gas is supplied to the airtight vessel 2 (period (H), FIG. 3). Thereafter, the valve 42 is closed successively for 10 seconds (period (I), FIG. 3). Thus, the HMDS gas is not supplied to the airtight vessel 2. In the HMDS gas supply period (period (H), FIG. 3), the valve 63 on the exhaust side is opened. The exhaust pump 64 is activated. Thus, the airtight vessel 2 is exhausted. Consequently, the airtight vessel 2 is filled with the HMDS gas as an atmospheric gas. In the HMDS gas stop period (period (I), FIG. 3), the valve 63 on the exhaust side is closed. Thus, the HMDS gas exhaust operation is stopped.

According to the control pattern shown in FIG. 3, in the HMDS gas supply period, new HMDS gas is successively supplied. While the supplied HMDS gas is cooling the wafer, the hydrophobic process progresses. On the other hand, in the HMDS gas supply stop period, while the cooled wafer portion is being heated to the original temperature by the table 21, the HMDS gas that resides in the airtight vessel 2 causes the hydrophobic process to progress.

Thus, according to the embodiment using the pattern shown in FIG. 3, as with the pattern shown in FIG. 2, while the temperature of the gas contact portion of the wafer W is suppressed from largely lowering, the hydrophobic process can be performed. Consequently, the hydrophobicity on the front surface of the wafer can be suppressed from deviating. In the HMDS gas supply stop period, since the deviation of the concentration of the gas becomes small, the hydrophobic process stably progresses.

Figure 4:
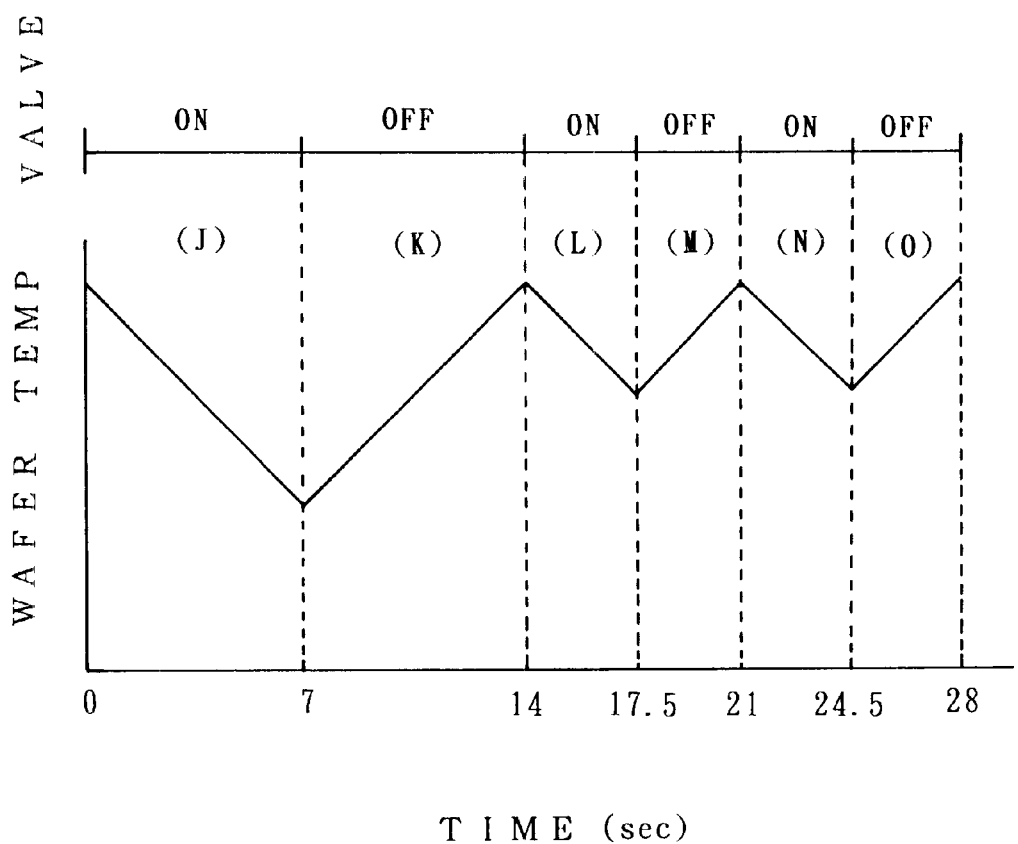
FIG. 4 is a graph showing a further other example of the variation of the wafer temperature in the substrate processing method according to the present invention.

FIG. 4 is a graph showing a further other example of the variation of the wafer temperature corresponding to the HMDS gas supply/stop operations due to open/close operations of the valve 42. In the example shown in FIG. 4, the valve 42 is opened successively for seven seconds. Thus, the HMDS gas is supplied to the airtight vessel 2 (period (J), FIG. 4). Thereafter, the valve 42 is closed successively for seven second. Thus, the HMDS gas is not supplied to the airtight vessel 2 (period (K), FIG. 4). Thereafter, the valve 42 is opened for 3.5 seconds at intervals of 3.5 seconds twice (periods (L) to (0), FIG. 4). In the period (K), the airtight vessel 2 is not exhausted. However, in the periods (J) and (L) to (O) shown in FIG. 4, the airtight vessel 2 is exhausted. In the period (J) shown in FIG. 4, since the HMDS gas is supplied, the temperature in the airtight vessel 2 largely lowers. However, in the period (K) shown in FIG. 4, since the airtight vessel 2 is not exhausted, while the hydrophobic process is progressing, the temperature in the airtight vessel 2 can be raised to a desired temperature. Thereafter, by repeating the HMDS gas supply/stop operations, as the hydrophobic process progresses, the temperature of the gas contact portion of the wafer lowers. While the hydrophobic process stops, the temperature of the gas contract portion of the wafer rises to the original temperature. Thereafter, the hydrophobic process resumes. Thus, while the temperature of the gas contact portion of the wafer W is suppressed from largely lowering, the hydrophobic process can further progress.

In the above-described embodiments, the valve 42 was opened and closed. Alternatively, the valve 42 may be a mass flow valve. With the valve, the flow rate of the HMDS gas may be adaptively controlled.

In addition, according to the above-described embodiments, the open/close operations of the valve 42 were controlled corresponding to the count result of the timer. Alternatively, as shown in FIG. 5, a temperature sensor 501 may be disposed in the table 21. The temperature sensor 501 detects the temperature of the wafer W that is being processed on the table 21. Corresponding to an output signal of the temperature sensor 501, the open/close operations of the valve 42 can be controlled as follows. After the valve 42 is opened, when the temperature of the wafer W becomes a predetermined temperature, the valve 42 is closed. When the temperature of the wafer W exceeds the predetermined temperature, the valve 42 is opened again. Thus, the temperature of the wafer W can be more accurately controlled.

Figure 6:
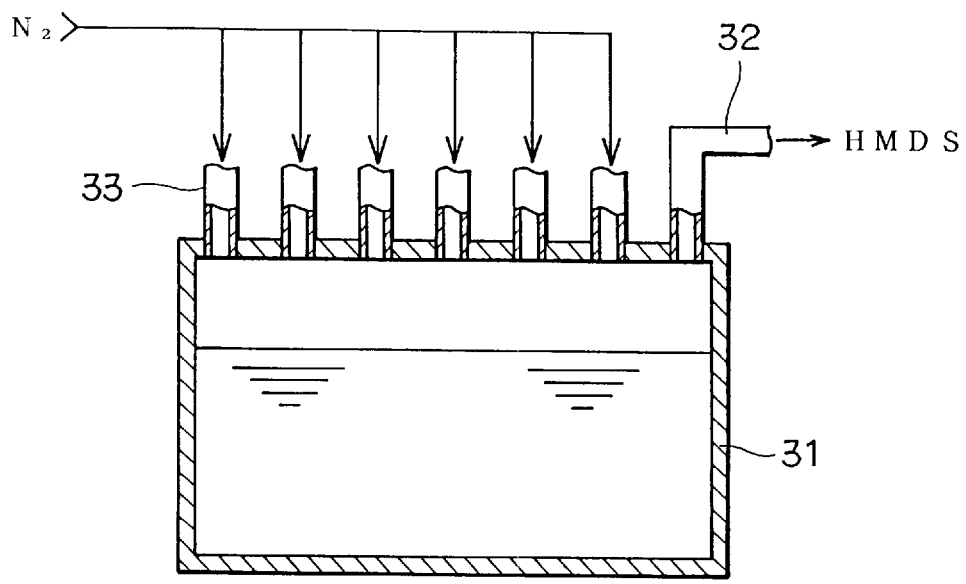
FIG. 6 is a schematic diagram showing another example of the structure of a gas supply source of the substrate processing unit according to the present invention.

In addition, as shown in FIG. 6, a reservoir 36 may be used instead of the reservoir 31 shown in FIG. 1. The reservoir 31 has a plurality of $N_2$ nozzles 33 (six $N_2$ nozzles 33 in the example shown in FIG. 6). With the reservoir 36, much $N_2$ gas can be sprayed to the surface of the HMDS solution than the reservoir 31 having one $N_2$ nozzle. Thus, HMDS gas with higher concentration can be supplied to the airtight vessel 2 than the reservoir 31. Consequently, the hydrophobic process can be effectively performed. In addition, the process time period can be shortened.

Next, the results of experiments conducted by the inventors of the present invention will be described. In the experiments, contact angles of water drops at 49 positions on each wafer processed in methods according to the present invention and those in a conventional method were measured. In the methods according to the present invention, the HMDS gas was supplied to wafers in the patterns shown in FIGS. 2 and 3 so as to perform the hydrophobic process. In the conventional method, the HMDS gas was supplied successively for 20 seconds to wafers so as to perform the hydrophobic process. As the experimental results of the wafers using the patterns shown in FIG. 2 and 3 in the methods according to the present invention, the deviation of contact angles on the front surfaces of the wafers was in the range from 1 to 2 degrees. In contrast, as the experimental results of the wafers in the conventional method, the deviation of contact angles on the front surfaces of the wafers was in the range from 3 to 4 degrees.

Figure 7:
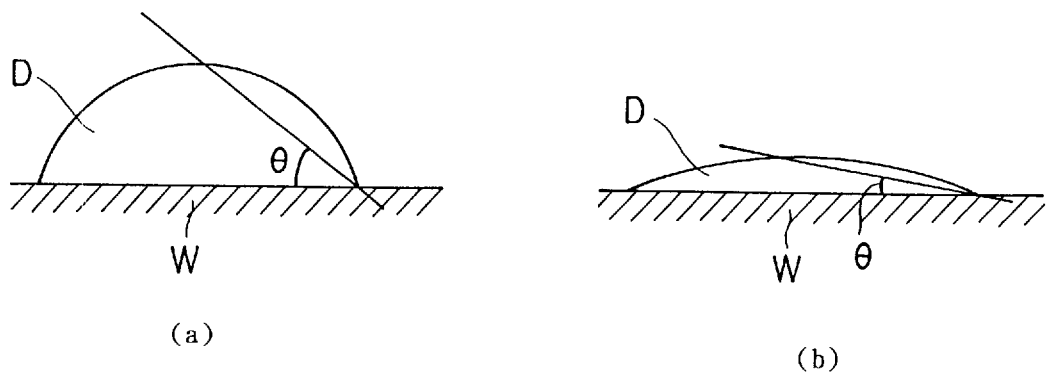
FIGS. 7A and 7B are schematic diagrams for explaining a contact angle of a water drop as an index of hydrophobicity.

The contact angle is an index that represents the state of a water drop on the front surface of a wafer W. As shown in FIG. 7, the contact angle is twice the angle θ of the straight line (dotted line) connecting the center of a water drop D and the outer periphery thereof to the front surface of the wafer W. As shown in FIG. 7B, when the contact angle 2θ is small, the front surface of the wafer W has hydrophilicity. As shown in FIG. 7A, as the contact angle 2θ becomes large, the hydrophobicity on the front surface of the wafer W becomes strong.

As the experimental results, since the deviation of contact angles of the above-described embodiments is smaller than those of the conventional method, the deviation of the hydrophobicity on the front surface of a wafer in the methods according to the embodiments of the present invention is smaller than that in the conventional method.

Next, with reference to FIGS. 8 and 9, an example of the structure of a coating and developing apparatus having the gas processing unit as a hydrophobic processing unit for use with the gas processing method according to the present invention will be described.

Figure 8:
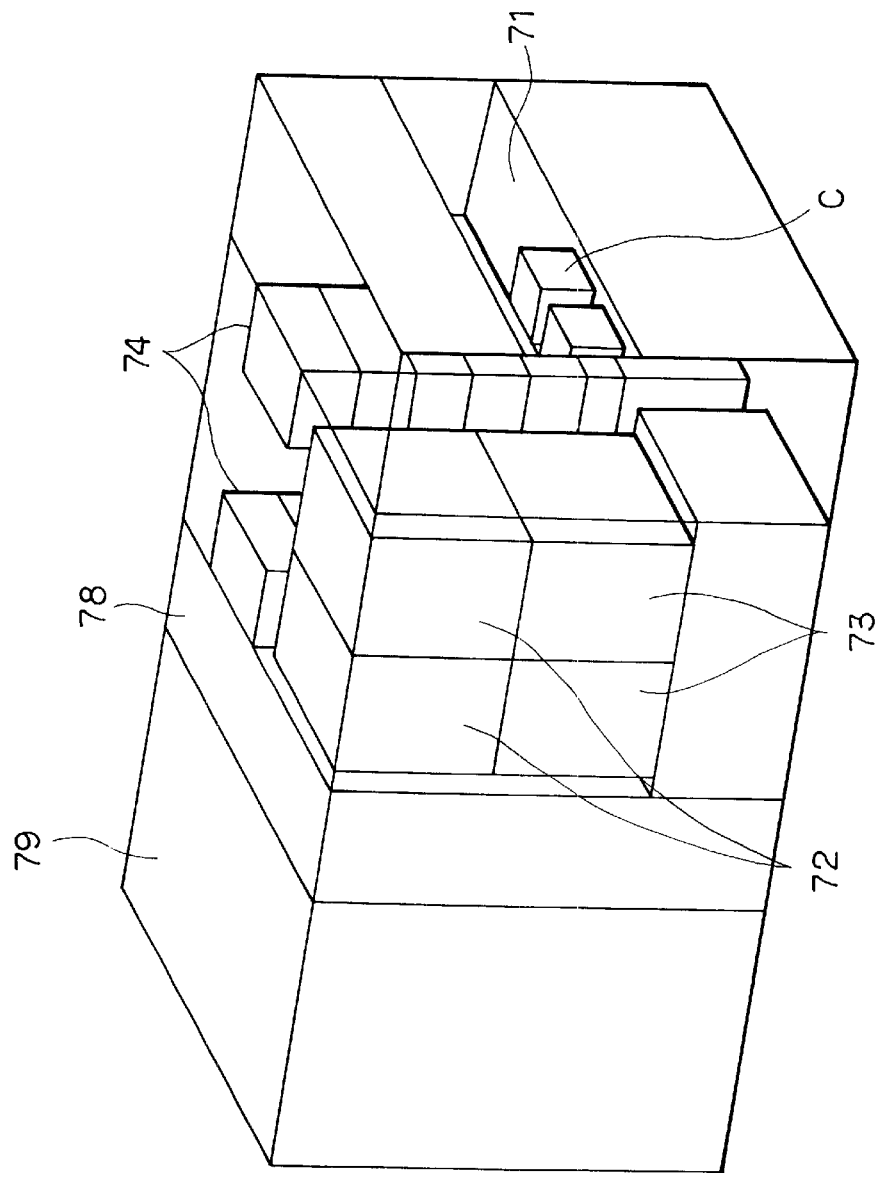
FIG. 8 is a perspective view showing an outlined structure of a coating and developing apparatus for use with a hydrophobic processing unit according to the present invention.
Figure 9:
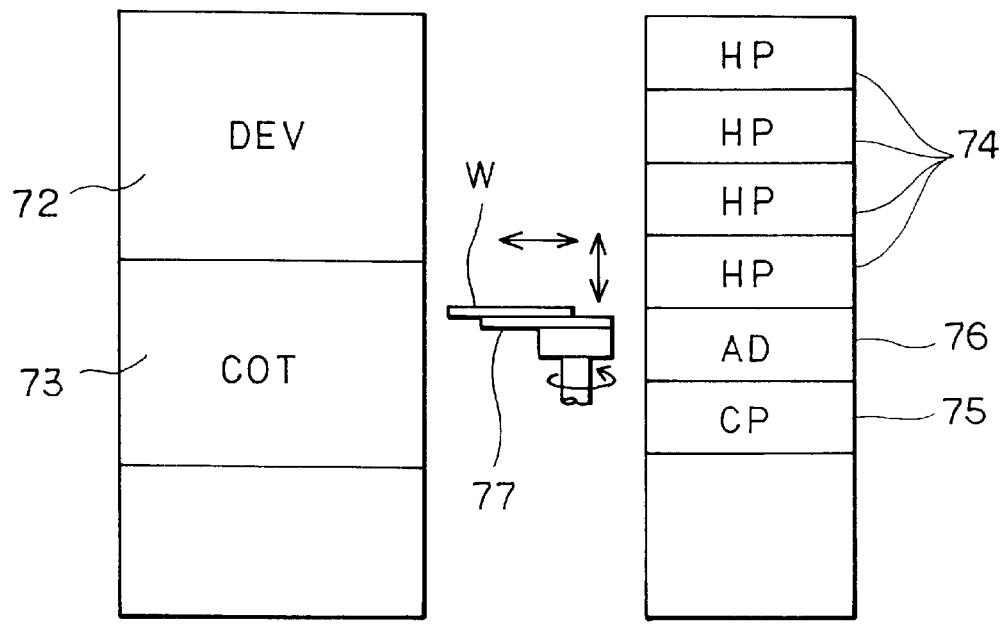
FIG. 9 is a sectional rear view showing the structure of the coating and developing apparatus shown in FIG. 8.

In FIG. 8, reference numeral 71 is a cassette loading/unloading stage on which a wafer cassette is loaded and unloaded. For example, a cassette C containing for example 25 wafers is placed on the cassette loading/unloading stage 71 by for example an automatic conveying robot. Viewed from the outside of the loading/unloading stage 71, a coating/developing unit group and a heating/cooling/hydrophobic processing unit group are disposed on the left side and the right side, respectively.

In the coating/developing unit group, two developing units 72 and two coating units 73 are disposed as upper units and lower units, respectively. In the heating/cooling/hydrophobic processing unit group, as shown in FIG. 9, heating units 74, cooling units 75, and hydrophobic processing units 76 are disposed.

A wafer conveying arm 77 is disposed as a substrate conveying means between the coating/developing unit group and the heating/cooling/hydrophobic processing unit group. The wafer conveying arm 77 can lift up and down, travel to the left and right, travel forward and backward, and rotate around the vertical axis. The wafer conveying arm 77 conveys a wafer among the coating/developing unit group, the heating/cooling/hydrophobic processing unit group, the loading/unloading stage 71, and an interface unit 78 (that will be described later). Hereinafter, a portion composed of the coating/developing unit group and the heating/cooling/hydrophobic processing unit group is referred to as clean track. The interface unit 78 is disposed between the clean track and an exposing unit 79. In the interface unit 78, a wafer is conveyed between the clean track and the exposing unit 79 by a conveying system (not shown).

Next, a flow of a wafer in the apparatus will be described. A wafer cassette C that contains wafers W is conveyed from the outside of the apparatus to the loading/unloading stage 71. The wafer conveying arm 77 (see FIG. 9) extracts a wafer W from the cassette C. After the heating/cooling/hydrophobic processing unit group performs the hydrophobic process for the wafer W, the coating unit 73 coats resist solution to the wafer W. Thus, a resist film is formed on the wafer W. The resultant wafer W is heated by the heating unit 74 and then conveyed to the exposing unit 79 through the interface unit 78. The exposing unit 79 exposes the wafer W with a mask corresponding to a predetermined pattern.

The resultant wafer W is heated by the heating unit 74. Thereafter, the heated wafer W is cooled by the cooling unit 75. The resultant wafer W is conveyed to the developing unit 72. The developing unit 72 develops the wafer W. Thus, a resist mask is formed on the wafer W. Thereafter, the wafer W is placed in the cassette C on the loading/unloading stage 71.

It should be noted that the present invention is not limited to the hydrophobic process. Instead, the present invention can be applied to a case that a flow of process gas supplied to an airtight vessel causes a temperature difference to take place on a substrate placed therein and thereby an improperly processed portion takes place.

Figure 10:
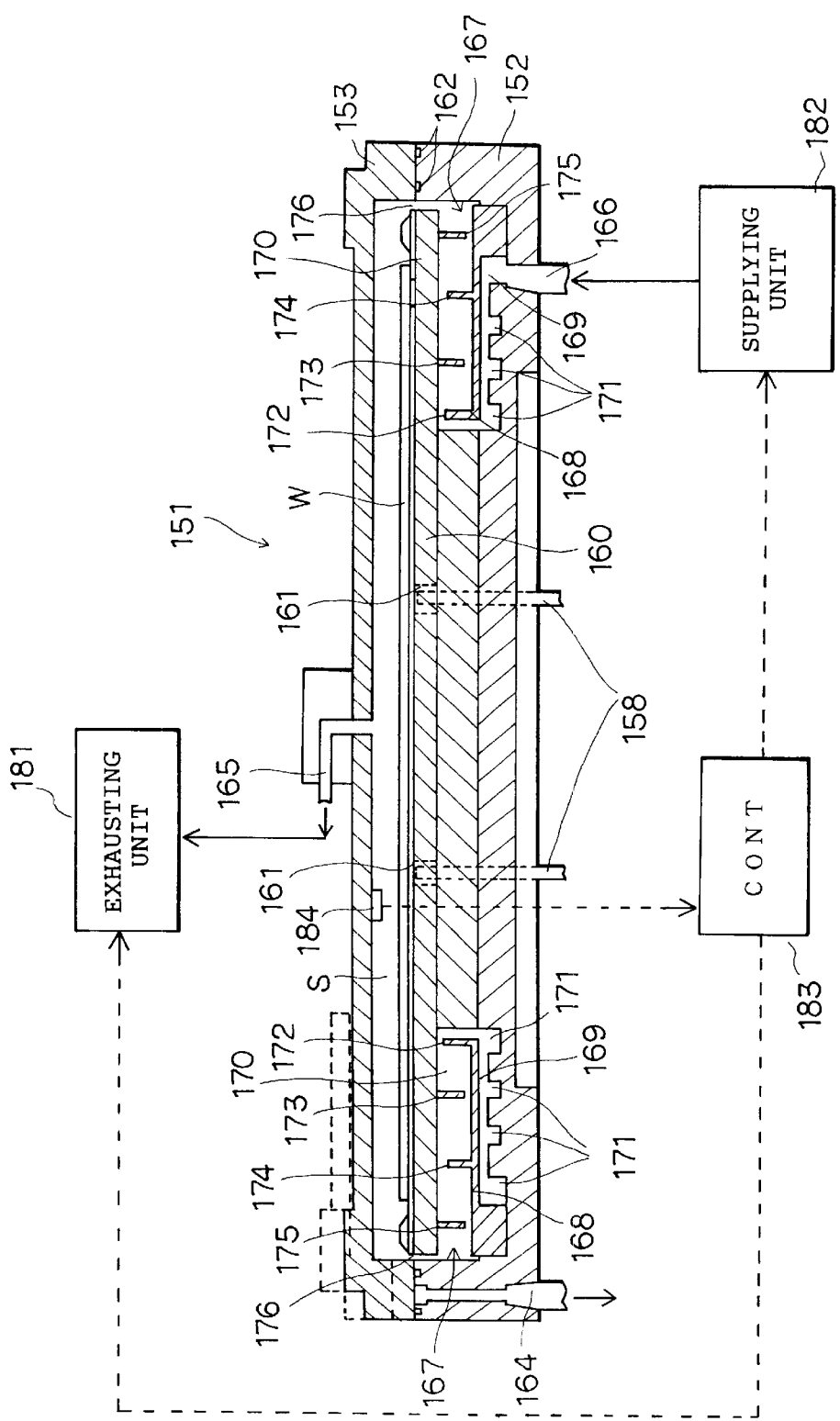
FIG. 10 is a sectional view showing the structure of an aging processing unit according to another embodiment of the present invention.

FIG. 10 is a sectional view showing an example of the structure of an aging processing unit according to the present invention. The aging processing unit performs an aging process for a wafer.

The aging processing unit shown in FIG. 10 performs a gelling process for a solated film (of which particles or colloid is dispersed in an organic solvent) coated as an insulation film on a wafer.

As shown in FIG. 10, a heating plate 160 is disposed at a nearly center position of a process chamber 152. The heating plate 160 is heated at around 100° C. as a temperature for the aging process with a heater. A plurality of (for example, three) concentric openings 161 are formed from the front surface to the rear surface of the heating plate 160. In each of the openings 161, a protrusive hold pin 158 is disposed. In the protruded state of the hold pins 158 that are protruded from the front surface of the heating plate 160, a wafer W is transferred with for example an external conveying unit. When a wafer W is transferred from the conveying unit to the process chamber 152, the wafer W is placed on the hold pins 158. Thereafter, the hold pins 158 are recessed in the heating plate 160. Thus, since the wafer W is directly placed on the heating plate 160, the wafer W is heated.

Above the process chamber 152, a lid 153 is disposed in such a manner that it can lift up and down. A seal member 162 is disposed on a contact surface of the lid 153 on the outer periphery of the process chamber 152. A plurality of sucking openings 164 are formed on the contact surface. The sucking openings 164 are connected to a vacuum unit (not shown). In the state that the lid 153 lifts down, the sucking openings 164 are vacuumed. Thus, the contact surface on the outer periphery of the lid 153 contacts the contact surface of the process chamber 152. Thus, an airtight vessel 151 is formed.

At a nearly center position of the lid 153 (in other words, above the center position of the heating plate 160), an exhaust opening 165 is formed. The exhaust opening 165 is connected to an exhausting unit 181.

A supply path 166 is disposed at an outer peripheral position on the rear surface of the process chamber 152. The supply path 166 is connected to a supplying unit 182. The supplying unit 182 supplies process gas containing ammonia ($NH_3$) gas and nitride ($N_2$) gas (as a purge gas) to the airtight vessel 151. A guide chamber 167 is formed from the outer periphery of the heating plate 160 to the front surface thereof. The guide chamber 167 temporarily stores the process gas that is supplied from the supplying means through the supply path 166 and guides the process gas to the heating plate 160.

A partition plate 168 is disposed in the guide chamber 167. The partition plate 168 partitions the guide chamber 167 into a lower chamber 169 and an upper chamber 170. The supply path 166 is formed on the outer side of the bottom surface of the lower chamber 169. The upper chamber 170 is connected to the lower chamber 169 through the partition plate 168.

For example, four circular guide grooves 171 are formed on the bottom surface of the lower chamber 169. The circular guide grooves 171 guide the process gas supplied from the supplying means along the outer periphery of the rear surface of the heating plate 160. In addition, for example, four circular guide plates 172 to 175 are formed in the upper chamber 170. The circular guide plates 172 to 175 guide the process gas supplied from the supplying means along the outer periphery of the rear surface of the heating plate 160. The guide plate 172 is disposed on the innermost periphery of the partition plate 168. The guide plate 172, the partition plate 168, and the rear surface of the heating plate 160 form a space. The guide plate 173 is disposed on the rear surface of the heating plate 160. The guide plate 172, the rear surface of the heating plate 160, and the partition plate 168 form a space. The guide plate 174 is disposed on the partition plate 168. The guide plate 174, the partition plate 168, and the rear surface of the heating plate 160 form a space. The guide plate 175 is disposed at the outermost peripheral position of the heating plate 160. The guide plate 175, the rear surface of the heating plate 160, and the partition plate 168 form a space. A space 176 is formed between the inner periphery of the process chamber 152 and the outer periphery of the heating plate 160. The process gas and nitrogen gas ($N_2$) (as a purge gas) are supplied from the guide chamber 167 to the front surface of the heating plate 160 through the space 176.

The exhausting unit 181 and the supplying unit 182 are controlled by a controlling portion 183. For example, under the control of the controlling portion 183, the exhausting unit 181 and the supplying unit 182 perform the ammonium gas supply/stop operations at timings shown in FIGS. 2 to 4. Thus, according to the embodiment shown in FIG. 10, the temperature variation in the process can be suppressed and the deviation of the aging process can be suppressed.

In FIG. 10, reference numeral 184 is a pressure detecting sensor. The pressure detecting sensor 184 may be disposed in the airtight vessel 151. Corresponding to the detected pressure of the airtight vessel 151, the exhausting unit 181 and the supplying unit 182 may be controlled. For example, after ammonium gas is supplied from the supplying unit 182 to the airtight vessel 151, when the pressure of the airtight vessel 151 exceeds a predetermined pressure, the ammonium gas is stopped. When the pressure of the airtight vessel 151 is lower than the predetermined pressure, the ammonium gas is supplied again. Thus, the process can be performed under a predetermined pressure. Consequently, the deviation of the process can be suppressed.

As described above, according to the present invention, while the temperature distribution on the front surface of a substrate is suppressed from largely deviating, the surface process can be performed. Thus, the deviation of the surface process (such as hydrophobic process and aging process) can be suppressed.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate processing unit, comprising:

an airtight vessel;

a substrate holder disposed in the airtight vessel for holding a substrate;

a heater for heating the substrate held on the substrate holder;

a process gas supplier for supplying process gas to the airtight vessel, temperature of the process gas supplied to the airtight vessel is lower than that of the substrate held on the substrate holder;

a controller for controlling flow rate of the process gas supplied to the airtight vessel;

wherein the controller regulates the temperature of the substrate by cooling the substrate by increasing the flow rate of the process gas being cooler than the substrate and by heating the substrate by decreasing the flow rate of the process gas.

2. The unit as set forth in claim 1, wherein said controlling means controls the flow rate of the process gas so that the process gas is intermittently supplied to said airtight vessel and the airtight vessel.

3. The unit as set forth in claim 1, wherein said controlling means controls the flow rate of the process gas so that the process gas is supplied to said airtight vessel and the airtight vessel is filled with the process gas as atmospheric gas and that the supply operation or the process gas is stopped and the process gas stop state is maintained.

4. The unit as set forth in claim 1, further comprising:

exhausting means for exhausting said airtight vessel in synchronization with the controlling operation of the flow rate of the process gas supplied to said airtight vessel.

5. The unit as set forth in claim 4, wherein said exhausting means stops exhausting the airtight vessel when the supply operation of the process gas to said airtight vessel is stopped.

6. The unit as set forth in claim 1, wherein said controlling means controls the flow rate of the process gas at a predetermined timing.

7. The unit as set forth in claim 1, wherein said controlling means controls the flow rate of the process gas corresponding to the inner state of said airtight vessel.

8. The unit as set forth in claim 7, further comprising:

means for detecting the inner temperature of said airtight vessel, wherein said controlling means controls the flow rate of the process gas corresponding to the detected temperature.

9. The unit as set forth in claim 7, further comprising:

means for detecting the inner pressure of said airtight vessel, wherein said controlling means controls the flow rate of the process gas corresponding to the detected pressure.

10. A substrate processing unit, comprising:

an airtight vessel having a substrate holding portion;

process gas supplying means for supplying process gas to the airtight vessel;

controlling means for controlling the flow rate of the process gas supplied to the airtight vessel; and means for detecting the inner temperature of said airtight vessel, wherein said controlling means controls the flow rate of the process gas corresponding to the inner state of said airtight vessel, and wherein said controlling means controls the flow rate of the process gas corresponding to the detected temperature to control the temperature of the substrate.

11. A substrate processing unit, comprising:

an airtight vessel having a substrate holding portion;

process gas supplying means for supplying process gas to the airtight vessel;

controlling means for controlling the flow rate of the process gas supplied to the airtight vessel; and exhausting means for exhausting said airtight vessel in synchronization with the controlling operation of the flow rate of the process gas supplied to said airtight vessel, wherein said exhausting means stops exhausting the airtight vessel when the supply operation of the process gas to said airtight vessel is stopped.

* * * * *